United States Patent [19]

Durandeau et al.

[11] 4,323,884
[45] Apr. 6, 1982

[54] DIGITAL-ANALOG INTERFACE FOR INSERTION BETWEEN A DIGITAL CONTROL SIGNAL TRANSMITTER AND A CONTROLLED MOVING ELEMENT

[75] Inventors: Michel Durandeau, Toulouse; Norbert Voisin, Bruguieres; Jean P. Verdier, Cazeres-sur-Garonne, all of France

[73] Assignee: Societe Nationale Industrielle Aerospatiale, France

[21] Appl. No.: 966,722

[22] Filed: Dec. 5, 1978

[30] Foreign Application Priority Data

Dec. 7, 1977 [FR] France .................. 77 36822

[51] Int. Cl.$^3$ .......................... H03K 13/02
[52] U.S. Cl. .................. 340/347 DA; 318/657; 340/347 M
[58] Field of Search ............ 340/347 M, 347 SY; 318/661, 569, 604, 656, 657

[56] References Cited

U.S. PATENT DOCUMENTS

| 3,071,324 | 1/1963 | Schroeder et al. | 340/347 SY X |
| 3,530,386 | 9/1970 | Terry | 340/347 M |
| 4,099,245 | 7/1978 | Maysonett | 340/347 SY X |
| 4,160,245 | 7/1979 | Scott | 318/569 X |

OTHER PUBLICATIONS

The Engineering Staff of Analog Devices, Inc., Analog-Digital Conversion Handbook, 6/1972, pp. I-8 and I-9; II-34 to II-39; II-80 and II-81.

Primary Examiner—Thomas J. Sloyan
Attorney, Agent, or Firm—Karl W. Flocks; A. Fred Starobin

[57] ABSTRACT

This invention relates to a digital-analog interface for insertion between the control circuit of a moving element and a transmitter of digital control signals.

This interface comprises an inductive detector of the actual position of the moving element. The inductive detector has a single primary winding directly connected to an a.c. source and two secondary windings. The detector secondary windings are connected in parallel to one input of a summing circuit, through a first resistance of fixed value and through a second resistance of adjustable value, respectively. Means responsive to the transmitter digital control signals are provided to adjust the value of the second resistance. The output of the summing circuit is connected to the control circuit of the moving element.

5 Claims, 5 Drawing Figures

DIGITAL-ANALOG INTERFACE FOR INSERTION BETWEEN A DIGITAL CONTROL SIGNAL TRANSMITTER AND A CONTROLLED MOVING ELEMENT

This invention relates to a digital-analog interface for insertion between, on the one hand, the circuit controlling a moving element, such as the servo valve of an electrohydraulic servocontrol whose position is to be controlled by analog electrical signals and, on the other hand, a transmitter of digital electrical signals for controlling the position of the moving element, the two secondary windings of an inductive detector of the position of the moving element and the control circuit thereof being disposed in a closed control loop.

With the development of digital techniques, the control signals for complex control patterns are being increasingly prepared by digital computers instead of analog computers especially in the case of electrical systems for aircraft flight control where many parameters are involved with respective coefficients which vary according to the prevailing flight conditions. However, the device for directly controlling the moving element, e.g. the servocontrol of a rudder, cannot be itself controlled in a simple manner by digital signals since the interfaces between the computer and the servocontrols are inductive position sensors and servovalves—i.e., devices which receive and transmit analog signals. Hydraulic servocontrols are indeed piloted by electrohydraulic servovalves which destribute the hydraulic fluid in dependence upon energization of a control electromagnet by an electric current. A position detector, which is usually an inductive device of the linear or rotary type and which is known as a "resolver", reproduces the position of the controlled moving element so that a position error signal can be prepared by comparison with the control signal (error signal loop).

In the present state of the art, resolvers which give a direct digital output are known; unfortunately, they are very expensive and they are unsuitable for use with aircraft servocontrols because of the severe environmental conditions in the unpressurized areas where such resolvers are located. Another, disadvantage of such resolvers, so far as use on board aircraft is concerned, is that they require either a large number of connecting wires, with a corresponding considerable increase in weight, or built-in electronic devices, which could not stand the severe environmental conditions and would make repairs more difficult. Resolvers of this kind each associated with a digital comparison circuit could form part of error signal loop circuits.

Devices which are at present under development would make it possible to use digital signals directly in the distribution stage of a hydraulic power element. Unfortunately, an electronic power circuit delivering digital signals is at least as complicated as the electronic power circuit which has to be associated with a servovalve to provide a comparable result; also, to obviate the effects of saturation in force and speed and so as not to prevent monitoring the satisfactory operation of an aircraft moving element, the resolver cannot possibly be omitted from the control circuit of the moving element.

Various kinds of analog to digital and digital to analog converters are known too. They are very costly, they are complex and they are unsuitable for use in a control loop circuit.

French Pat. No. 1,230,575 to Compagnie Générale de Télégraphie Sans Fil, filed on Apr. 1, 1959 and published on Sept. 16, 1960, discloses a coordinate translator adapted to convert a digital control signal into analog information related to the angular position of a moving element. This translator comprises a resolver having a stator and a rotor coupled to an electric motor. The resolver stator has two primary windings perpendicular to each other, which are supplied from an a.c. source through a first relay matrix operated by the control signal bits of higher weights. The resolver rotor has two secondary windings perpendicular to each other, one of said windings being connected to a second relay matrix operated by the control signal bits of lower weights. The other secondary winding and the output of the second matrix are connected to a differential amplifier, the output of which energizes the electric motor coupled to the resolver rotor. An accurate angular position of the resolver rotor can be obtained only when the second relay matrix has a very intricate structure, so that this digital to analog converter is an expensive heavy device of low reliability.

A first object of this invention is to realize a digital-analog interface in which the disadvantages of the prior art devices are eliminated.

A second object of this invention is to realize a digital-analog interface unit for insertion between the control circuit of an angularly or linearly moving element, such as the servo valve of an electrohydraulic servocontrol, and a transmitter of digital control signals corresponding to the angular position $\theta$ or the linear position X to be imparted to the moving element, said interface unit comprising an inductive detector mounted for detecting the actual angular or linear position of the moving element, said detector having a single primary winding directly connected to a.c. source and two secondary windings, a summing circuit having an output connected to said control circuit of the moving element and at least one input connected to said two secondary windings of the inductive detector through a first and a second resistance, connected in parallel to each other, said first resistance having a fixed value R and said second resistance having an adjustable value Ri, and means responsive to the digital control signals of said transmitter for adjusting said second resistance to the value $Ri = R/\tan\theta$ or $R \cdot A/X$, A being a constant factor.

This invention therefore helps to provide a simple interface for the uses described above and provides the following advantageous possibilities:

1. A commercially available inductive position detector can be used instead of a position detector specifically made to have a low transformation ratio spread and low temperature variation patterns;

2. The position detector can be supplied from the standard aircraft 26 volt 400 Hz supply or from a similar supply without the need for special electrical generating facilities (with the advantages of a higher frequency, improved voltage and frequency stability and low harmonic content);

3. The control signals do not need to be modulated in dependence upon the detector supply voltage amplitude to obviate the effects of variations in the supply voltage amplitude.

Preferred embodiments of the invention will now be described, and are shown diagrammatically in the accompanying drawings wherein.

Like references denote like elements throughout the drawings.

We shall first recall some features of inductive position detectors. The accuracy of the signal output by an inductive position detector is affected by:

(a) The transformation ratio error, consisting of:
1. Manufacturing error, which is approximately in the range of 2 to 5% for conventional inductive detectors and is about 1% for especially made detectors, and
2. Temperature variation error, which is sometimes the reason for using a supply frequency higher than 400 Hz to reduce the effect of temperature on the transformation ratio;

(b) The error introduced by variations in the voltage supplied to the primary winding, such variations reacting on the signal developed on the secondary windings with the same results as a variation of the transformation ratio, and (c) The electrical or linearity error.

This error is something line 7 to 10 minutes of angle for a deflection of ±30° to ±40° for angular position detectors of the synchro-transmitter type.

This error is always greater than or equal to 1% of the maximum signal produced in the deflection zone for linear position detectors.

The main errors are those due to transformation ratio scatter or spread among the detectors of a same type and errors due to supply voltage variations.

This invention helps to reduce these errors very considerably by providing a special processing of the data output from a synchro-transmitter or from a linear position inductive detector having a differential transformer.

Figure 1:
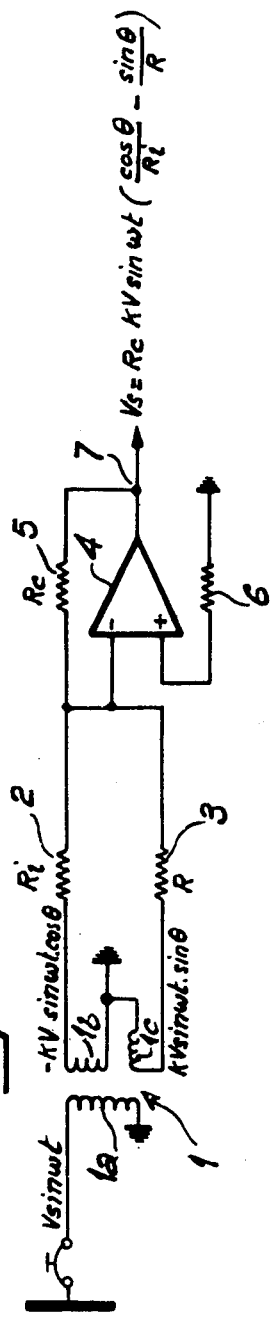
FIG. 1 shows a summing circuit arrangement for the "sine" and "cosine" signals produced by an inductive angular position detector.

FIG. 1 shows a resolver or synchro-transmitter 1 having a stator with a single primary winding 1a supplied by a voltage $V \cdot \sin \omega t$. The rotor of synchro-transmitter 1 is coupled to an angularly moving element (not shown), the angular position of which is to be controlled. This rotor has a first secondary winding 1b, which receives a first signal $-KV \cdot \sin \omega t \cdot \cos \theta$ and a second secondary winding 1c, which receives a second signal $KV \cdot \sin \omega t \cdot \sin \theta$, K denoting the synchro-transmitter transformation ratio and $\theta$ denoting the relative angular position of the said primary and secondary windings. The first signal $-KV \cdot \sin \omega t \cdot \cos \theta$ is applied to the negative input of an amplifier 4 through a resistance 2 of value Ri, and the second signal $KV \cdot \sin \omega t \cdot \sin \theta$ is applied to the same input through a resistance 3 of value R. The positive input of amplifier 4 is earthed through a resistance 6 and a resistance 5 of value Rc connects amplifier output terminal 7 to its negative input.

The amplifier 4 sums up the currents having respective strengths:

$$\frac{KV \sin \omega t \cdot \sin \theta}{R} \text{ and } \frac{KV \sin \omega t \cdot \cos \theta}{Ri}$$

Amplifier 4 delivers an output signal Vs at its output terminal 7 whose value is given by:

$$\frac{Vs}{Rc} = -\left[\frac{KV \sin \omega t \cdot \sin \theta}{R} - \frac{KV \sin \omega t \cdot \cos \theta}{Ri}\right]$$

$$= KV \sin \omega t \cdot \left[\frac{\cos \theta}{Ri} - \frac{\sin \theta}{R}\right].$$

This output signal is zero when: $(\cos \theta)/(Ri) - (\sin \theta)/(R) = 0$, i.e., when $(\sin \theta)/(\cos \theta) = \tan \theta = (R)/(Ri)$.

Clearly, therefore, for resistance having given values R and Ri, the angle $\theta$ at which the output signal Vs is zero is not affected by variations of V, K and $\omega$. For a fixed value R a value $\tan \theta$ corresponds to each value Ri.

Figure 2:
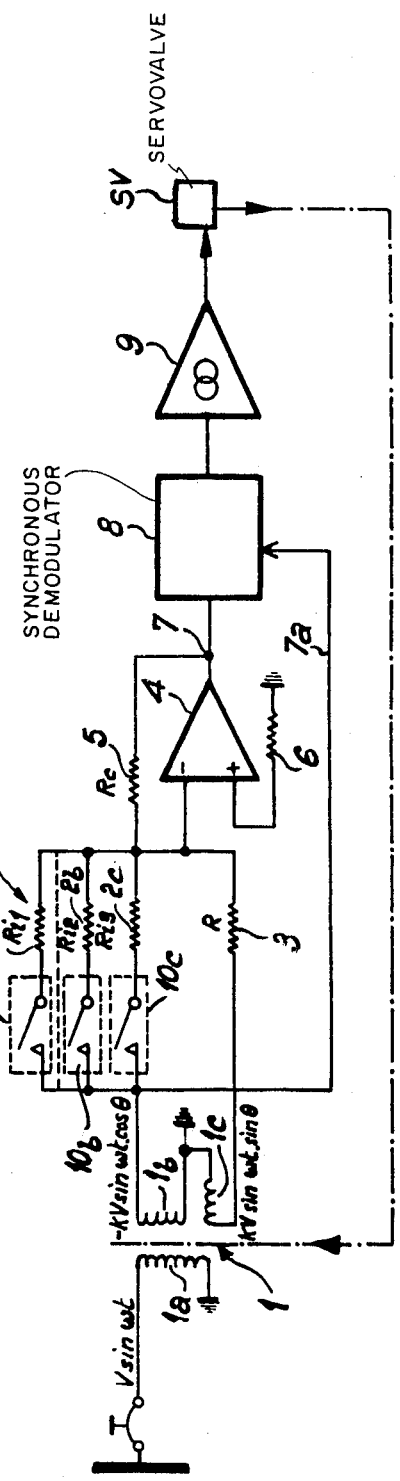
FIG. 2 shows a first embodiment of the invention for an angularly moving element.

In the embodiment of the summing circuit arrangement of FIG. 1 which is shown in FIG. 2, the single resistance of value Ri has been replaced by n resistances 2a, 2b, 2c and so on, having respective values $Ri_1$, $Ri_2$, $Ri_3$ and so on, and each disposed in series with a respective one of n contact switches 10a, 10b, 10c and so on, so that n different positions of the controlled moving element can be produced by closing e.g. just one of the n contacts at a time. For each of these n positions a zero error signal occurs just when the controlled moving element reaches the angular position corresponding to the selected value Ri. The circuit arrangement of FIG. 2 also comprises a synchronous demodulator 8 which receives the signal from the output 7 of amplifier 4 and, via a line 7a, a reference voltage serving for demodulation and supplied from the "cosine" output (1b) of synchro-transmitter 1. The demodulator 8 converts the modulated signal into d.c. The demodulated signal is applied to a current amplifier 9 supplying a servovalve SV which controls the moving element (not shown), e.g. a rudder, with an electric current analog signal.

The demodulation reference voltage is selected to correspond to the "cosine" signal (winding 1b) of the synchro-transmitter 1, since the latter signal does not become equal to zero and does not change sign in the usual range of deflection or movement of a rudder—usually from 30° to 60° wide. Said range is centered on 0° (the neutral position of the rudder) and the true zone of deflection is −15° to +15° or −30° to +30°. In such a zone the sine signal becomes equal to zero for 0° and changes sign. Also, since the signals produced by the inductive detectors are out of phase with their supply voltage and this phase difference can vary from one detector to another, the demodulation reference voltage is, with advantage, taken from a secondary winding, for the phase of the demodulation signal is then adapted automatically to the phase of the signal to be demodulated, contrary to what would happen if the reference voltage was to be taken from the primary winding or supply, e.g. from the 400 Hz aircraft supply system.

The final position of the controlled moving element is not affected by variations of V and K, but the error signal is affected by such variations when it is other than zero—i.e., in the transient state—since the error signal is proportional to $$KV \sin \omega t \cdot \left[ \frac{\cos \theta}{Ri} - \frac{\sin \theta}{R} \right].$$

However, errors during transient conditions are of minor importance, the main consideration being the accurary of the final position of the controlled moving element.

Figure 3:
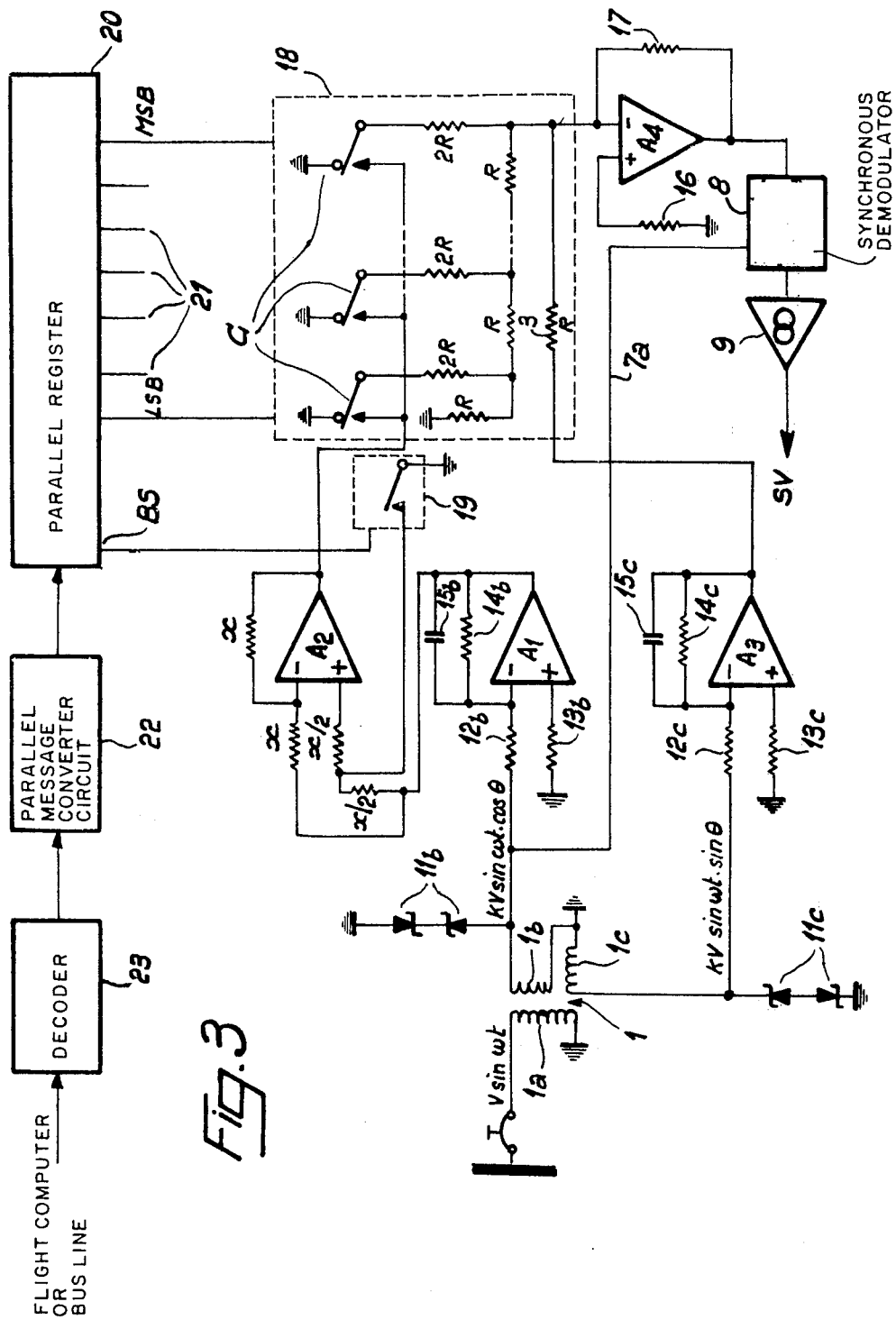
FIG. 3 shows a second embodiment of the invention for an angularly moving element.

In the second embodiment of the invention, shown in FIG. 3, the group of Ri resistances and contacts 10 of FIG. 2 is replaced by a resistance and contact network 18 of known kind, comprising resistances having only valves R and 2R. A network of this kind, which is conventionally used as a decoding network, can provide a large number of resistance values—256 values with an 8-bit network, 1024 values with a 10-bit network, and so on. A parallel register 20 is used to control the relay contacts C of network 18; relay contacts C may or may not form part of network 18 and they function substantially as the contacts 10a, 10b, 10c and so on, of FIG. 2. The secondary winding 1b or the "cosine" output of the synchro-transmitter 1 is connected to the negative input of a combined amplifier and impedance matcher A1 through a resistance 12b. Two Zener diodes 11b are connected is series with one another, and biased in opposite directions, between winding 1b and earth. A resistance 13b connects the positive input of amplifier A1 to earth. A resistance 14b and a capacitance 15b provide a parallel connection between the output and the negative input of amplifier A1. A similar arrangement is provided by means of the combined amplifier and impedance matcher A3 for the secondary winding 1c, or the "sine" output of the synchro-transmitter 1, using components 11c, 12c, 13c, 14c and 15c. The Zener diodes 11b, 11c serve to chop high over-voltages. The amplifiers A1, A3, which are connected as inverters, are adjusted to adapt the amplitude dynamic range of the synchro-transmitter 1 to that of the following stages, particularly to that of network 18 comprising resistances of values R and 2R. The adjustments are made by means of resistances 12b, 12c and 13b, 13c and by means of negative feedback resistances 14b, 14c. Capacitances 15b, 15c serve to filter high-frequency disturbances.

The output of amplifier A3 is connected through a resistance 3 of value R to the negative input of an inverting summing amplifier A4; advantageously, the resistance 3 is the resistance normally used to provide negative feedback for the output summing amplifier A4 and is included in the resistance network 18 when it is manufactured. Consequently, the resistance 3 has exactly the same value as the other resistances of value R of the network 18. The negative input of amplifier A4 is also connected to the output of the network 18. The positive input of amplifier A4 is earthed through an adjusting resistance 16. The output of amplifier A4 is connected to its negative input through a negative feedback resistance 17.

The output of amplifier A1 (corresponding to the "cosine" signal) is connected to the negative and positive inputs of an amplifier A2 in parallel through a resistance of value x for its negative input and through two resistances of value x/2 for its positive input, the two latter resistances being connected in series and having their centre point earthed through a relay contact 19 which is operated by the sign bit supplied by output BS of parallel register 20.

Another resistance having the value x is arranged as a negative feedback resistance between the output and the negative input of amplifier A2. The output thereof is connected to the input of network 18. The contacts C thereof are operated by the respective outputs 21 of the parallel register 20. The same receives at its input the output signals of a series-to-parallel converting circuit 22 which receives at its input the output signals of a decoding circuit 23. The input thereof is the input of the digital-analog interface according to this invention; this interface input receives the series digital signal intended for controlling the energizing means, e.g. the servovalve SV of a servocontrol operating an aircraft rudder.

Because of the circuit arrangement of the amplifier A2 with the resistances of values x and x/2, the amplifier A2 has a gain of 2 via its positive input and a gain of $-1$ via its negative input. When contact 19 is open, the output signal of amplifier A1 is received by both inputs of amplifier A2 which provides a total gain of $+2+(-1)=+1$. When contact 19 is closed, the signal from amplifier A1 is received only at the negative input of amplifier A2 and the gain thereof is $-1$. The output signal of amplifier A2 is therefore in phase opposition to its input signal (output signal of amplifier A1) but is in phase with its input signal when the contact 19 is open. This circuit arrangement is therefore a means of providing a+ or− sign to the "cosine" signal corresponding to the series message received by the decoder 23 by means of the bit sign BS and thus to define a displacement of the moving element relatively to a central (or zero) position, eg. the position of a rudder in the plane of the corresponding aircraft tail member. The amplifier A2 and its associated circuits therefore form a phase-inverting circuit controlled by contact 19.

The series message received by decoder 23 comes, for example, from a flight computer or a bus line, is decoded by decoder 23 and converted into a parallel message by circuit 22. The parallel message is fed into register 20 which operates the contacts C of network 18 selectively to form, by means of some at least of the resistances of the network 18, a resistance value corresponding to a desired value of tan $\theta$—ie: to a desired relative angular position $\theta$ of the primary and secondary windings of the synchro-transmetter 1 and therefore to a desired angular position of the moving element.

The "cosine" signal processed by the resistance network 18 is summed with the "sine" signal by the amplifier A4 which produces at its output a modulated analog position error signal. After synchronous demodulation in the demolutator 8 and amplification by amplifier 9, as in the case of FIG. 2, this position error signal is transmitted to the servovalve SV of a servocontrol.

The system shown in FIG. 3 and described in the foregoing is therefore a digital-analog interface interposed between a transmitter of digital control signals and an angularly moving element adapted to be controlled only by analog signals. The number of possible selected values of tan $\theta$ is $2^N$, N being the number of bits which the network 18 can receive from the register 20. The control instruction is a digital signal representing the tangent of the desired angular position of the moving element and comprising one bit for the sign and other bits for the absolute value of the desired angle. The latter bits operate the relay contacts C of the network 18 whereas the sign bit operates the relay contact 19 enabling the "cosine" signal to be applied in phase or in antiphase to amplifier A4.

Within the scope of the invention, another possibility is to include parallel register 20 in the network 18 of resistances and contacts; it is also possible to use, for example, a digital control signal coded in staggered binary code, in which case the sign contact 19 can be omitted.

Figure 4:
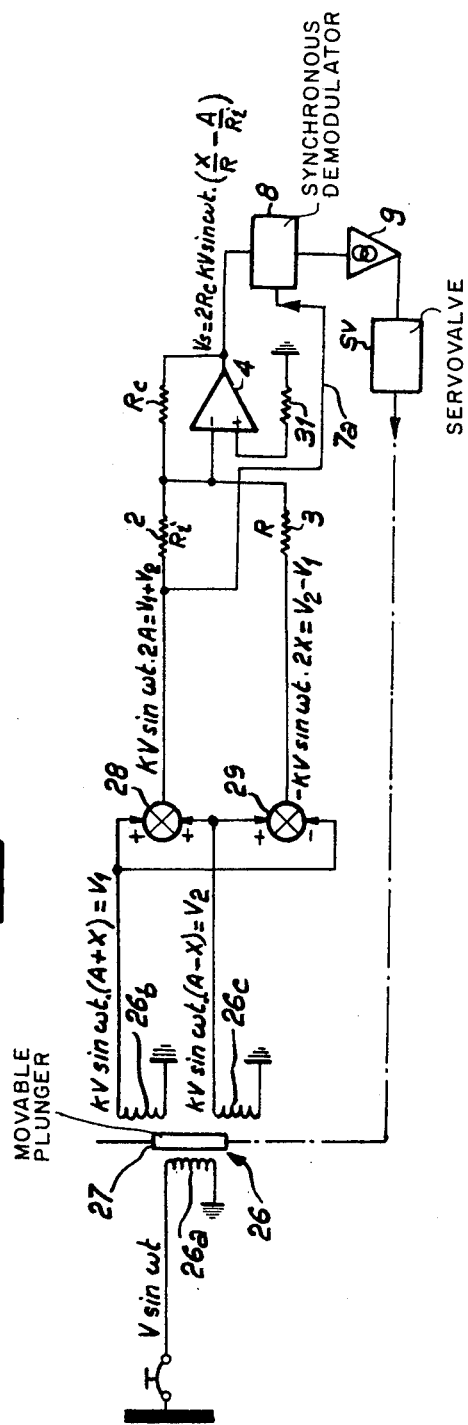
FIG. 4 shows a third embodiment of the invention for a linearly moving element.

FIG. 4 shows an embodiment of the invention for a linearly moving element to which an inductive linear position detector having a differential transformer is coupled. This known kind of detector is useful, in as much as it may be made very rugged and reliable since its only moving part has no winding. Basically, a detector of this kind comprises two parts:

(a) a stationary frame or body having three windings—a single a.c. energized primary winding and two secondary windings—and (b) a ferromagnetic plunger which is moved along the axis of the stationary frame or body and which distributes the flux produced by the primary winding between the two secondary windings in accordance with the actual position of the plunger relatively to the frame or body.

The effective output signal of such a detector is the difference between the voltages induced in the two secondary windings. Such output signal is a linear function of plunger movement. The plunger rod is rigidly connected, for example, to the piston of an electrohydraulic servocontrol whose movement is linear and parallel to the piston rod.

As in the case of all inductive detectors the accuracy of the output signal of a linear position detector of this kind is affected by variations in the supply voltage and the transformation ratio. The output signal is also affected by linearity errors. The transformation ratio is a difficult factor to control with this kind of linear position detector. What is often done to stabilize the value of the transformation ratio is to energize the primary winding at high frequencies of the order from 5,000 to 10,000 Hz. This means calls for the existence of a special power supply to energize the detector—a complication and an additional cause of failures. The invention also obviates these disadvantages and helps to obviate the effects of transformer ratio variations.

FIG. 4 shows a linear position detector comprising a differential transformer 26 having a stationary frame (not shown) with a primary winding 26a energized by a signal $V \cdot \sin \omega t$, a first secondary winding 26b producing a signal $(A+X)KV \cdot \sin \omega t = V1$, a second secondary winding 26c producing a signal $(A-X) \cdot KV \cdot \sin \omega t = V2$, and a movable plunger 27 whose rod is, for example, rigidly secured to the piston (not shown) of an electrohydraulic servocontrol SV operating an aircraft rudder (not shown).

The expression for the signals V1 and V2 produced by the secondary windings 26b and 26c implies that the relative position of the detector frame and plunger at which such signals are equal is taken as the zero position. In these expressions A denotes a constant that is proportional to the amplitude of the signals when $X=0$, X being the relative linear movement of the detector frame and plunger—e.g., a value equal or directly proportional to the movement of the controlled moving element. As previously, K denotes the transformation ratio of the linear position detector.

It will be apparent that:

$$V2 + V1 = 2A \cdot KV \cdot \sin \omega t$$

$$V2 - V1 = 2X \cdot KV \cdot \sin \omega t.$$

These operations are performed by summing circuits 28, 29 respectively, which each receive V1 and V2. Circuit 28 adds V2 and V1 together and circuit 29 subtracts V1 from V2. The output of circuit 28 is connected to the negative input of a summing amplifier 4 through a resistance Ri. The output of circuit 29 is connected through a resistance R to the negative input of amplifier 4.

The positive input of amplifier 4 is connected to earth through an adjusting resistance 31. A negative feedback resistance Rc connects the negative input to the output of amplifier 4.

The term for the signal Vs at the output of amplifier 4 is:

$$Vs = -\left[ \frac{KV \sin \omega t \cdot 2A}{Ri} - \frac{KV \sin \omega t \cdot 2X}{R} \right] \cdot Rc,$$

so that:

$$Vs = 2 \cdot Rc \cdot KV \cdot \sin \omega t \cdot \left[ \frac{X}{R} - \frac{A}{Ri} \right].$$

The output signal is zero when $(X/R) = (A/Ri)$, i.e., when $(X/A) = (R/Ri)$, or $(V1 - V2)/(V1 + V2) = (R/Ri)$;

clearly, X/A is independent of the transformation ratio of the differential transformer 26 and of its supply voltage.

If, as in the embodiment of FIG. 3, Ri is replaced by a network of relay contacts and resistances having the values R and 2R, there is obtained a device which, when controlled as previously described, can be interposed as a digital-analog interface between a transmitter of digital control signals and a moving element to be controlled only by analog signals, the said interface comprising an inductive detector as a linear position detector.

The signal (V1+V2), which does not disappear and which does not alter its phase in the usual range of the linear movement of the moving element, is transmitted as a demodulation reference voltage via a line 7a to a synchronous demodulator 8.

Figure 5:
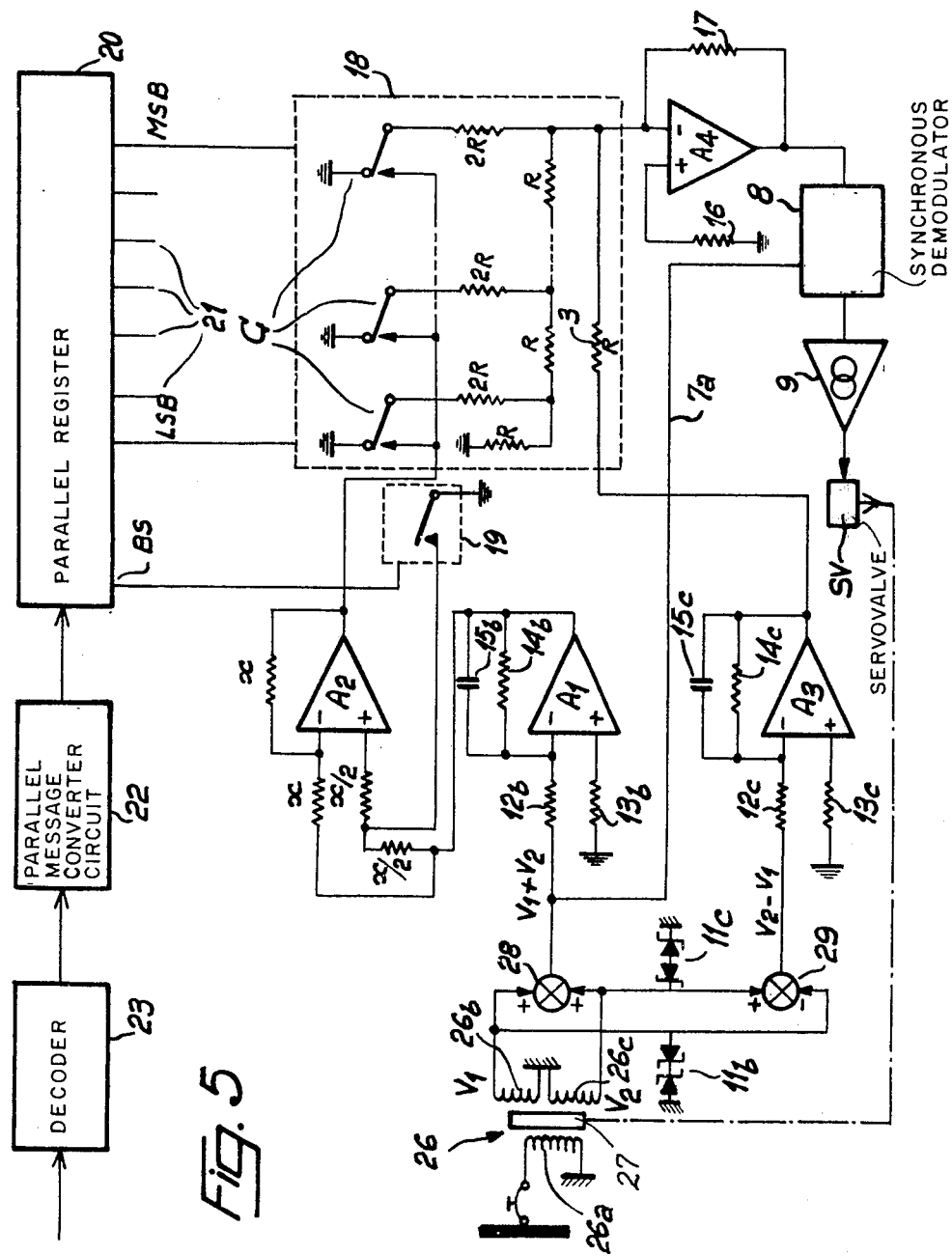
FIG. 5 shows a fourth embodiment of the invention for a linearly moving element.

FIG. 5 shows the complete circuit arrangement of such an embodiment of the invention. Like elements have the same references as in FIGS. 3 and 4. Operation is as for the second embodiment except that the "cosine" signal is replaced by (V1+V2) and the "sine" signal is replaced by (V2−V1).

Tests of an interface according to the invention were carried out by the Applicants with a synchro-transmitter supplied with a 400 Hz signal. Measurements were made for two resistance values Ri, one corresponding to a desired angular position $\theta$ of 20° and the other to a desired position of 45°. The results show that the error of $\theta$ relatively to the desired value, which is defined by $\tan \theta = R/Ri$, and at which the output signal (or error signal) is zero, is substantially below 1 minute of angle for variations of almost 20% in supply voltage and supply frequency.

These results also show that $\theta$ is particularly insensitive to the harmonic content of the supply voltage, since the error is of the same order of magnitude for a sinusoidal, square or triangular wave form.

We claim:

1. In a closed servo-loop system for insertion between on the one part a control circuit of a moving element, such as the servo-valve of an electrohydraulic servocontrol, whose position X is to be controlled by analog electrical signals, and on the other part a transmitter of signals for controlling the position X to be imparted to the moving element, said transmitter providing digital electrical control signals, said closed servo-loop system including an inductive linear position detector having a movable plunger connected to said moving element and a differential transformer for detecting the position X of said moving element, said detector having a single primary winding and two secondary windings, said two secondary windings generating voltages $V_1$ and $V_2$ varying with the position of the movable plunger, the difference of voltages $V_1$ and $V_2$ being proportional to the position X of the moving element and the sum of said voltages $V_1$ and $V_2$ being proportional to a constant A, and a digital-analog interface unit including first summing means connected to receive said voltages $V_1$ and $V_2$ and for adding voltages $V_1$ and $V_2$ and for forming an output signal, second summing means connected to receive said voltages $V_1$ and $V_2$ and for subtracting voltage $V_1$ from voltage $V_2$ and for forming an output signal, first resistance means having an adjustable value Ri and connected to receive said output signal of said first summing means, second resistance means having a fixed value R and connected to receive said output signal of said second summing means, means for adjusting the value of said first resistance means to $Ri = R \cdot A/X$, summing circuit means having an input connected to said first and second resistance means, and a synchronous demodulator having a signal input connected to the output of said summing circuit means and a synchronization input connected to receive said output signal of said first summing means, said demodulator having an output for transmitting an output signal of said interface unit to the control circuit.

2. In a system according to claim 1 in which said first resistance means having an adjustable value is in the form of a selectively adjustable resistance network having an input and an output and comprising a first plurality of resistances of value 2R, and switching means for interconnecting resistances selected in said first and second plurality of resistances and for inserting said interconnected resistances between said network input and output.

3. In a system according to claim 2, in which a decoder, a series-to-parallel converting circuit and a parallel register are connected in series and inserted between said transmitter and said switching means of said resistance network.

4. In a system according to claim 3, further comprising switching means for making operative a phase-inverting circuit inserted upstream of said resistance network, and a line connecting said means for making operative said phase-inverting-circuit to the ouput of said parallel register which generates a sign bit of the digital control signal.

5. In a system according to claim 1 in which two filter circuits adapted for impedance and dynamic range matching are respectively inserted upstream of said first resistance means of adjustable value and of said second resistance means of fixed value.

* * * * *